(12) United States Patent
Hashimoto et al.

(10) Patent No.: US 6,919,574 B2
(45) Date of Patent: Jul. 19, 2005

(54) ELECTRON BEAM EXPOSURE APPARATUS, DEFLECTION APPARATUS, AND ELECTRON BEAM EXPOSURE METHOD

(75) Inventors: Shin-ichi Hashimoto, Tokyo (JP); Haruo Yoda, Tokyo (JP); Masato Muraki, Tokyo (JP)

(73) Assignees: Advantest Corporation, Tokyo (JP); Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/672,469

(22) Filed: Sep. 26, 2003

(65) Prior Publication Data

US 2004/0061080 A1 Apr. 1, 2004

(30) Foreign Application Priority Data

Sep. 27, 2002 (JP) ........................................ 2002-284254

(51) Int. Cl.⁷ ................................................. H01J 3/14

(52) U.S. Cl. ............................... 250/492.22; 250/492.2; 250/492.3

(58) Field of Search ......................... 250/492.22, 492.2, 250/492.3

(56) References Cited

U.S. PATENT DOCUMENTS

| | | | | |
|---|---|---|---|---|
| 3,644,700 A | * | 2/1972 | Kruppa et al. | 219/121.29 |
| 4,145,597 A | * | 3/1979 | Yasuda | 219/121.26 |
| 4,437,008 A | * | 3/1984 | Matsuda et al. | 250/396 R |
| 5,448,075 A | * | 9/1995 | Fueki et al. | 250/492.22 |
| 5,557,314 A | * | 9/1996 | Okamoto et al. | 347/230 |
| 6,703,624 B2 | * | 3/2004 | Hamaguchi et al. | 250/492.2 |

* cited by examiner

*Primary Examiner*—Nikita Wells
*Assistant Examiner*—Anthony Quash
(74) *Attorney, Agent, or Firm*—Muramatsu & Associates

(57) ABSTRACT

An electron beam exposure apparatus for exposing a wafer by an electron beam incorporates a circuit structure for conducting a scan test to self-diagnose the electrical connections. The electron beam exposure apparatus includes: an electron beam generating section for generating the electron beam; a plurality of deflectors for deflecting the corresponding electron beams; a deflection control section for outputting a deflection control signal for causing the deflector to deflect the electron beam; and a control signal storage section for storing a value of the deflection control signal output from the deflection control section. The control signal storage section connects the plurality of deflectors in series when conducting the scan test. The control signal storage section and the deflector may be monolithically integrated on a semiconductor substrate.

10 Claims, 3 Drawing Sheets

ELECTRON BEAM EXPOSURE APPARATUS, DEFLECTION APPARATUS, AND ELECTRON BEAM EXPOSURE METHOD

This patent application claims priority from a Japanese patent application, 2002-284254 filed on Sep. 27, 2002, the contents of which are incorporated herein by reference.

BACKGROUND OF THE INVENTION

1. Field of the Invention

The present invention relates to an electron beam exposure apparatus, a deflection apparatus, and an electron beam exposure method. More particularly, the present invention relates to an electron beam exposure apparatus for exposing a wafer by an electron beam.

2. Description of the Related Art

In an electron beam exposure apparatus, a deflection control section controls deflectors to deflect an electron beam, and electrical connection between the deflection control section and the deflector is checked by measuring the deflected electron beam.

However, many numbers of processes are required for the measurement of the electron beam and complicated electrical connections are involved in the electron beam exposure apparatus. Therefore, it is difficult to check the connections between the deflection control section and the deflector conventionally. Thus, what is needed is a circuit structure embedded in an electron beam exposure apparatus that enables a self-testing to check the connections before deflecting the electron beams.

SUMMARY OF THE INVENTION

Therefore, it is an object of the present invention to provide an electron beam exposure apparatus, a deflection apparatus, and an electron beam exposure method which can solve the foregoing problem. The above and other objects can be achieved by combinations described in the independent claims. The dependent claims define further advantageous and exemplary combinations of the present invention.

According to the first aspect of the present invention, there is provided an electron beam exposure apparatus for exposing a wafer by an electron beam. The electron beam exposure apparatus includes: an electron beam generating section for generating the electron beam; a deflector for deflecting the electron beam; a deflection control section for outputting a deflection control signal for causing the deflector to deflect the electron beam; and a control signal storage section for storing a value of the deflection control signal output from the deflection control section. The control signal storage section and the deflector may be monolithically integrated on a semiconductor substrate.

Moreover, the deflection control section may output the plurality of deflection control signals, and the deflector may include: an aperture penetrating through the semiconductor substrate through which the electron beam passes; and a plurality of deflecting electrodes provided in edges of the aperture for receiving the plurality of deflection control signals, respectively, the plurality of deflecting electrodes being electrically isolated from one another. The control signal storage section may store the values of the plurality of deflection control signals. Moreover, the electron beam exposure apparatus may further include a switch for switching whether the deflection control signal is to be supplied to the control signal storage section.

Moreover, the deflection control section may output the deflection control signal, which is a binary signal, which is to be stored in the control signal storage section when the switch supplies the deflection control signal to the control signal storage section, and the deflection control section may output the deflection control signal, which is an analog signal, when the switch does not supply the deflection control signal to the control signal storage section.

Moreover, the electron beam exposure apparatus may further include a plurality of the deflectors, and the deflection control section may supply a plurality of deflection control signals to the plurality of deflectors, and the control signal storage section may store values of the plurality of deflection control signals in parallel, and outputs them to the deflection control section in series.

Moreover, the deflection control section may further output a clock signal, the control signal storage section may output a value of the deflection control signal according to the clock signal, and the deflection control section may suspend the output of the clock signal when the deflector is deflecting the electron beam. The control signal storage section may include a shift register including a plurality of flip-flops provided corresponding to the plurality of deflectors, the flip-flops storing thereon values of the corresponding deflection control signals.

Moreover, the deflection control section may diagnose contact between each of the plurality of deflectors and the deflection control section based on the deflection control signals output from the control signal storage section. The deflection control section may identify one of the deflectors which is not connected to the deflection control section.

According to the second aspect of the present invention, there is provided a deflection apparatus for deflecting an electron beam based on a deflection control signal. The deflection apparatus includes: a control signal storage section storing thereon a value of the deflection control signal; and a deflector for deflecting the electron beam based on the deflection control signal.

According to the third aspect of the present invention, there is provided an electron beam exposure method for exposing a wafer by an electron beam. The electron beam exposure method includes steps of: outputting a deflection control signal for causing a deflector to deflect the electron beam; storing a value of the deflection control signal output in the deflection control signal outputting step; generating the electron beam; and deflecting the electron beam.

The summary of the invention does not necessarily describe all necessary features of the present invention. The present invention may also be a sub-combination of the features described above.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
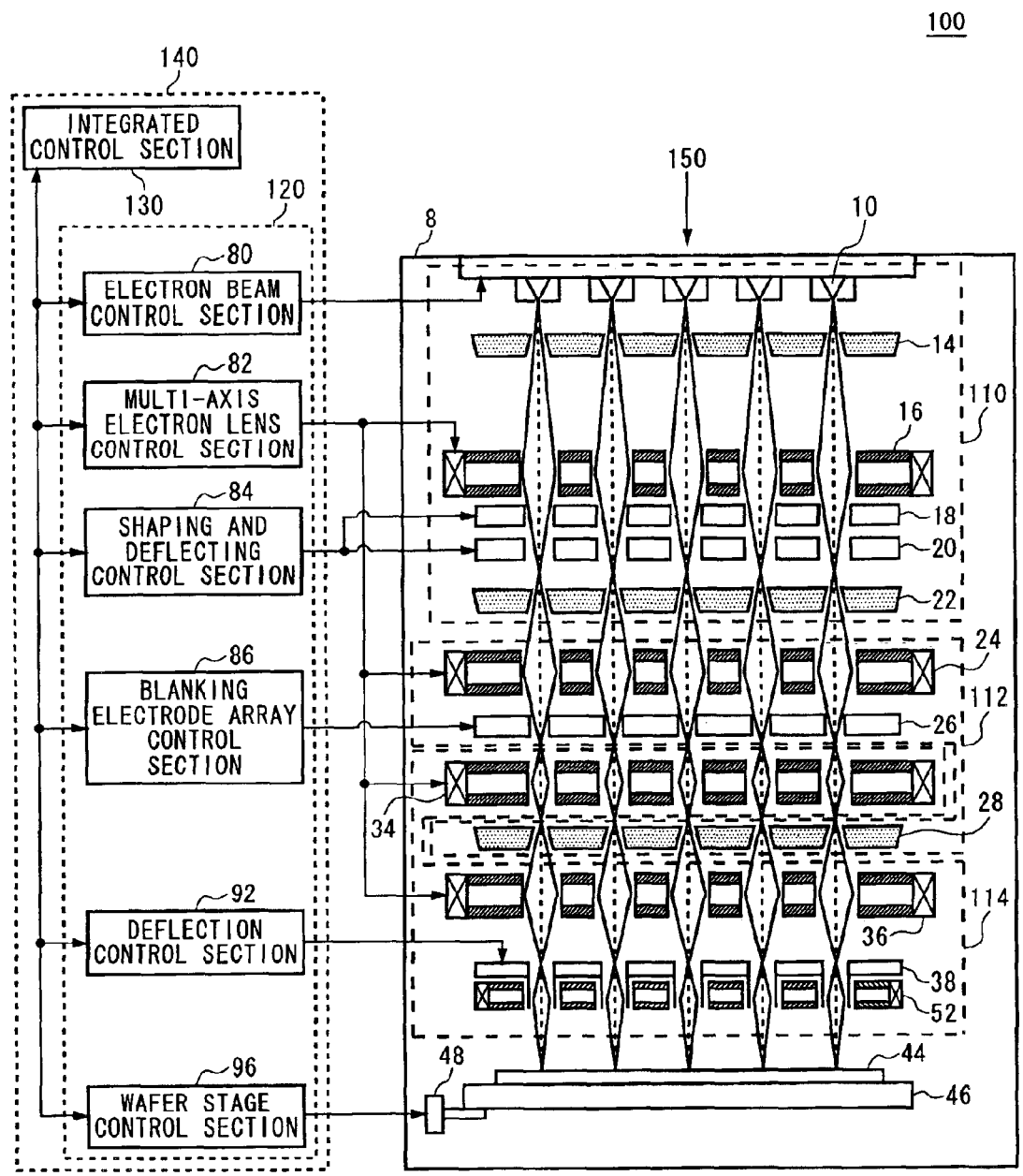
FIG. 1 is a schematic view showing a configuration of an electron beam exposure apparatus according to an embodiment of the present invention.

FIG. 1 is a schematic view showing a structure of an electron beam exposure apparatus 100 according to an embodiment of the present invention. According to the present embodiment, the electron beam exposure apparatus 100 easily checks contact between a deflection control section and a deflector. The electron beam exposure apparatus 100 includes an exposure section 150 for performing a predetermined exposure processing on a wafer 44 by an electron beam, and a control system 140 for controlling operation of each component of the exposure section 150.

The exposure section 150 includes an electron optics system, which includes: electron beam shaping means 110 for generating a plurality of electron beams in a chamber 8 and shaping cross-sectional shapes of the electron beams into desired shapes; irradiation switching means 112 for switching whether the plurality of electron beams are to be applied on the wafer 44, respectively; and a wafer projection system 114 for adjusting direction and size of an image of a pattern which is to be exposed on the wafer 44. Moreover, the exposure section 150 includes a stage system, which includes: a wafer stage 46 on which the wafer 44 is mounted, where the patterns are to be exposed on the wafer 44; and a wafer stage drive section 48 for driving the wafer stage 46.

The electron beam shaping means 110 includes: an electron beam generating section 10 for generating the plurality of electron beams; a first electron beam shaping section 14 and a second electron beam shaping section 22 including a plurality of openings for shaping the cross-sectional shapes of the discharge electron beams by allowing the electron beams to pass through the openings; a first multi-axis electron lens 16 for focusing the plurality of electron beams independently and adjusting the focal points of the plurality of electron beams; and a first shaping deflecting section 18 and a second shaping deflecting section 20 for independently deflecting the plurality of electron beams which have passed through the first electron beam shaping section 14. The second electron beam shaping section 22 includes a substrate, a plurality of shaping openings provided in the substrate, and a substrate heating section for heating the substrate.

The exposure switching section 112 includes a second multi-axis electron lens 24 for focusing the plurality of electron beams independently and adjusting the focal points of the plurality of electron beams, a blanking electrode array 26 for independently switching whether or not each of the electron beams is to be irradiated on the wafer 44 by deflecting each of the plurality of electron beams independently, and an electron beam blocking member 28, which includes a plurality of apertures through which the electron beams pass, for blocking the electron beam deflected by the blanking electrode array 26. In another example, the blanking electrode array 26 is a blanking aperture array device.

The wafer projection system 114 includes a third multi-axis electron lens 34 for focusing the plurality of electron beams independently and decreasing irradiated cross-sectional area of the electron beams, a fourth multi-axis electron lens 36 for focusing each of the plurality of electron beams independently and adjusting a focal point of each of the electron beams, a deflecting section 38 for independently deflecting each of the plurality of electron beams into a desired location on the wafer 44, and a fifth multi-axis electron lens 52, which functions as an object lens for the wafer 44, for focusing each of the plurality of electron beams independently.

The control system 140 includes an individual control section 120 and an integrated control section 130. The individual control section 120 includes an electron beam control section 80, a multi-axis electron lens control section 82, a shaping and deflecting control section 84, a blanking electrode array control section 86, a deflection control section 92, and a wafer stage control section 96. For example, the integrated control section 130 is a workstation which controls each of the controllers included in the individual control section 120.

The electron beam control section 80 controls the electron beam generating section 10. The multi-axis electron lens control section 82 controls electric current supplied to the first multi-axis electron lens 16, the second multi-axis electron lens 24, the third multi-axis electron lens 34, the fourth multi-axis electron lens 36, and the fifth multi-axis electron lens 52. The shaping and deflecting control section 84 controls the first shaping deflector 18 and the second shaping deflector 20. The blanking electrode array control section 86 controls voltage applied to deflection electrodes of the blanking electrode array 26. The deflection control section 92 controls voltage applied to the deflection electrodes of a plurality of deflectors of the deflecting section 38. The wafer stage control section 96 controls the wafer stage driver 48 so that the wafer stage 46 is caused to move to a predetermined location.

Operation of the electron beam exposure apparatus 100 according to the present embodiment will be explained hereinafter. First, the electron beam generating section 10 generates the plurality of electron beams. The first electron beam shaping section 14 shapes the plurality of electron beams, which are on the first electron beam shaping section 14, by allowing them to pass through a plurality of apertures of the first electron beam shaping section 14. In another example, a plurality of electron beams are generated by further including means for dividing an electron beam generated by the electron beam generating section 10 into a plurality of electron beams.

The first multi-axis electron lens 16 independently collects each of the plurality of electron beams, which is shaped into rectangular shape, and independently adjusts focal point of each of the electron beams to the second electron beam shaping section 22. The first shaping deflector 18 independently deflects the plurality of electron beams, which are shaped into rectangular shapes by the first electron beam shaping section 14, so that the plurality of electron beams are irradiated on desired positions on the second electron beam shaping section 22.

The second shaping deflector 20 deflects the plurality of electron beams deflected by the first shaping deflector 18 in substantially perpendicular direction to the second electron beam shaping section 22, and irradiates them on the second electron beam shaping section 22. Then, the second electron beam shaping section 22, which includes a plurality of apertures having rectangular shapes, further shapes the plurality of electron beams, which have rectangular cross-sectional shapes and are irradiated on the second electron beam shaping section 22, into the electron beams having desired cross-sectional shapes for irradiating them on the wafer 44. At this time, in the second electron beam shaping section 22, the substrate heating section heats the substrate, in which shaping openings are provided based on the cross-sectional shapes of the electron beams which are to be irradiated on the wafer 44, and maintains the shape of the substrate.

The second multi-axis electron lens 24 independently collects the plurality of electron beams, and independently adjusts the focal point of each of the electron beams to the blanking-electrode array 26. Then, the plurality of electron beams, of which the focal points are adjusted by the second multi-axis electron lens 24, respectively pass through a plurality of apertures of the blanking-electrode array 26.

The blanking electrode array control section 86 controls whether or not voltage is applied to the deflecting electrodes provided in the vicinity of each of the apertures of the blanking-electrode array 26. The blanking-electrode array 26 selects whether or not each of the electron beams are irradiated on the wafer 44 based on the voltage applied to each of the deflecting electrodes.

The electron beam which is not deflected by the blanking-electrode array 26 passes through the third multi-axis electron lens 34. Then, the third multi-axis electron lens 34 reduces the diameter of the electron beam which passes through the third multi-axis electron lens 34. The reduced electron beam passes through an aperture of the electron beam blocking member 28. Moreover, the electron beam blocking member 28 blocks the electron beam deflected by the blanking-electrode array 26. The electron beam which has passed through the electron beam blocking member 28 enters the fourth multi-axis electron lens 36. Then, the fourth multi-axis electron lens 36 independently collects each of the entered electron beams, and respectively adjusts the focal point of each of the electron beams to the deflecting section 38. The electron beam, of which the focal point is adjusted by the fourth multi-axis electron lens 36, enters the deflecting section 38.

The deflection control section 92 controls a plurality of deflectors of the deflecting section 38, and independently deflects each of the electron beams, which enters the deflecting section 38, into the position where it is to be irradiated on the wafer 44. The fifth multi-axis electron lens 52 adjusts the focal point of each of the electron beams to the wafer 44 which passes through the fifth multi-axis electron lens 52. Then, each of the electron beams, having the cross-sectional shape which is to be irradiated on the wafer 44, is irradiated on a desired position of the wafer 44, where it is to be irradiated.

During the exposure processing, it is preferable that the wafer stage drive section 48 continuously moves the wafer stage 46 to a predetermined direction based on an instruction from the wafer stage control section 96. Then, according to the movement of the wafer 44, a desired circuit pattern is exposed on the wafer 44 by shaping the cross-sectional shape of each of the electron beams to the shapes which are to be irradiated on the wafer 44, by selecting the apertures, which allow the passage of the electron beams which are to be irradiated on the wafer 44, and by deflecting each of the electron beams so that it is irradiated on the desired position of the wafer 44.

Figure 2:
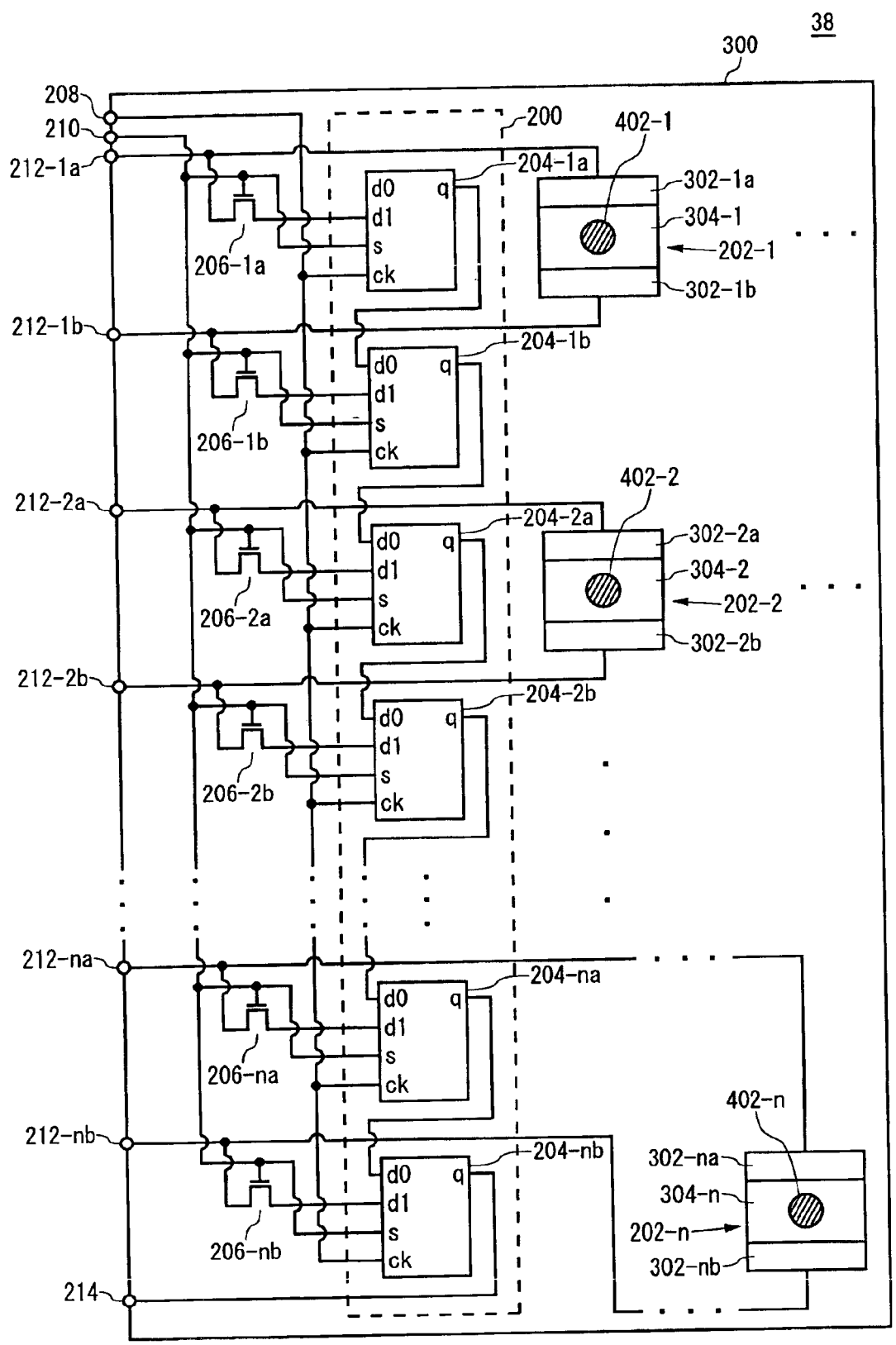
FIG. 2 is a drawing exemplary showing a detailed configuration of a deflecting section.

FIG. 2 is a drawing exemplary showing a detailed configuration of the deflecting section 38. The deflecting section 38 is an example of the multi-deflection device for independently deflecting a plurality of electron beams 402-1 to 402-n generated by the electron beam generating section 10 (refer to FIG. 1). The deflecting section 38 includes a semiconductor substrate 300, a clock input terminal 208, a diagnostic control signal input terminal 210, a plurality of deflection control signal input terminals 212-1a to 212-nb, a diagnostic result signal output terminal 214, a plurality of deflectors 202-1 to 202-n, a shift register 200, and a plurality of switches 206-1a to 206-nb.

The semiconductor substrate 300 is made of a semiconductor, such as silicon. In the present embodiment, the shift register 200, the plurality of deflectors 202-1 to 202-n, and the plurality of switches 206-1a to 206-nb are monolithically integrated on the semiconductor substrate 300.

The clock input terminal 208, the diagnostic control signal input terminal 210, the plurality of deflection control signal input terminals 212-1a to 212-nb, and the diagnostic result signal output terminal 214 are integrated on the semiconductor substrate 300, and are electrically connected to the deflection control section 92 (refer to FIG. 1). The clock input terminal 208 receives a clock signal from the deflection control section 92. The diagnostic control signal input terminal 210 receives a diagnostic control signal from the deflection control section 92 for controlling the shift register 200. The plurality of deflection control signal input terminals 212-1a to 212-nb receive a plurality of deflection control signals, which are independent from one another, from the deflection control section 92. The diagnostic result signal output terminal 214 outputs a diagnostic result signal based on the plurality of deflection control signals to the deflection control section 92.

For example, the plurality of deflectors 202-1 to 202-n are arrayed and integrated on the semiconductor substrate 300. Moreover, the plurality of deflectors 202-1 to 202-n deflect the plurality of electron beams 402-1 to 402-n respectively based on the deflection control signals.

The deflector 202-1 includes an aperture 304-1 and a plurality of deflecting electrodes 302-1a and 302-1b. The aperture 304-1 penetrates through the semiconductor substrate 300, and allows the electron beam 402-1 to pass through it.

The plurality of deflecting electrodes 302-1a and 302-1b are provided in edges of the aperture 304-1. The plurality of deflecting electrodes 302-1a and 302-1b are electrically isolated. The deflecting electrode 302-1a connects with the deflection control signal input terminal 212-1a electrically, and receives one of the deflection control signals from the deflection control section 92. Moreover, the deflecting electrode 302-1b connects with the deflection control signal input terminal 212-1b electrically, and receives another deflection control signal from the deflection control section 92. Thereby, the deflection control section 92 applies voltage to the plurality of deflecting electrodes 302-1a and 302-1b, respectively. The deflector 202-1 deflects the electron beam 402-1 in accordance with the voltage applied to the plurality of deflecting electrodes 302-1a and 302-1b.

Since each of the plurality of deflectors 202-2 to 202-n has the same or similar function as/to that of the deflector 202-1, the explanation will be omitted. The deflection control section 92 supplies the plurality of deflection control signals to the plurality of deflecting electrodes 302-1a to 302-nb, respectively. Each of the plurality of deflecting electrodes 302-1a to 302-nb deflects each of the plurality of electron beams 402-1 to 402-n according to the received deflection control signal.

The shift register 200 is an example of the control signal storage section for storing values of the plurality of deflection control signals output from the deflection control section 92. In the present embodiment, the shift register 200 includes a plurality of flip-flops 204-1a to 204-nb. The plurality of flip-flops 204-1a to 204-nb are provided corresponding to the plurality of deflectors 202-1 to 202-n, respectively, and store the value of the corresponding deflection control signals. For example, the plurality of flip-flops 204-1a to 204-nb are realized by MOS transistors integrated on the semiconductor substrate 300.

Each of the plurality of flip-flops 204-1a to 204-nb includes input terminals S, CK, d0, and d1 and an output terminal q. The input terminal S connects with the diagnostic control signal input terminal 210 electrically, and receives the diagnostic control signal. The input terminal CK connects with the clock input terminal 208 electrically, and receives the clock signal. The input terminal d0 connects with the output terminal q of the previous flip-flop 204 electrically, and receives the output signal of the previous flip-flop 204. Moreover, the input terminal d1 connects with the corresponding deflection control signal input terminal 212 electrically through the corresponding switch 206, and receives the deflection control signal.

Here, the flip-flop 204 stores the value of the signal received by either the input terminal d0 or the input terminal d1 according to the clock signal received by the input terminal CK based on the diagnostic control signal received by the input terminal S. In the present embodiment, the flip-flop 204 stores the value of the deflection control signal received by the input terminal d1 when the diagnostic control signal is a first value, and it stores the value of the output signal of the previous flip-flop 204 received by the input terminal d1 when the diagnostic control signal is a second value.

Therefore, in case that the diagnostic control signal is the first value, each of the plurality of flip-flops 204-1a to 204-nb stores the values (scan test data) of the corresponding deflection control signals. Thereby, the shift register 200 stores the values (scan vector: a set of scan test data) of the plurality of deflection control signals in parallel.

Moreover, the flip-flop 204 outputs the stored value according to the clock signal received by the input terminal CK. Therefore, each of the plurality of flip-flops 204-1a to 204-nb supplies the value of the stored deflection control signal to the next flip-flop 204 according to the clock signal. In other words, the scan vector received in parallel fashion is shifted in a series fashion in the shift register 200 by the timing of the clock signal. Thereby, the shift register 200 outputs the values (scan vector) of the stored deflection control signals to the diagnostic result-signal output terminal 214 in series according to the clock signal. The deflection control section 92 receives the output signal from the shift register 200 as the diagnostic result signal based on the plurality of deflection control signals. Thereby, the scan test for the plurality of deflection control signals, which are to be received by the plurality of deflecting electrodes 302-1a to 302-nb, is performed.

The plurality of switches 206-1a to 206-nb are arranged between the corresponding deflection control signal input terminal 212 and the shift register 200, and switches whether the plurality of deflection control signals are to be supplied to the shift register 200.

The switch 206 connects electrically the corresponding deflection control signal input terminal 212 and the d1 terminal of the flip-flop 204 according to the diagnostic control signal. For example the switch 206 is a MOS transistor receiving the diagnostic control signal at the gate terminal. If the diagnostic control signal is the first value, the switch 206 connects electrically the input terminal 212 and the d1 terminal of the flip-flop 204 (close), and, if it is the second value, the switch 206 disconnects them electrically (open).

In the present embodiment, the deflection control section 92 supplies the deflection control signal to the deflector 202 through the deflection control signal input terminal 212. Moreover, the shift register 200 stores the value of the deflection control signal between the deflection control signal input terminal 212 and the deflector 202, and outputs the diagnostic result signal based on the deflection control signal. Moreover, the deflection control signal input terminal 212, the deflector 202, and the shift register 200 are integrated on the single semiconductor substrate 300. Therefore, the deflection control section 92 diagnoses the electrical connection between each of the plurality of deflectors 202-1 to 202-n and the deflection control section 92 based on the diagnostic result signal. For example, the deflection control section 92 identifies the deflector 202 which is not connected to the deflection control section 92 by comparing the value of the diagnostic result signal with an expected value. According to the present embodiment, the connection between the deflection control section 92 and the deflector 202 is checked easily. Thereby it is easily judged whether the malfunction of the electron beam exposure apparatus 100 is caused by the defect of the connection or not.

According to another embodiment, each deflector 202 includes three or more deflecting electrodes 302. The three or more deflecting electrodes 302 receive deflection control signals, which are independent from one another. The shift register 200 stores three or more deflection control signals (scan vectors) received by the deflector 202, respectively. Also in this case, the electrical connection between the deflection control section 92 and the deflector 202 can be checked easily.

Alternatively, each of the first shaping deflecting section 18, the second shaping deflecting section 20, and the blanking-electrode array 26, which are explained in relation to FIG. 1, includes the same or similar configuration as/to that of the deflecting section 38. In this case, the first shaping deflecting section 18 and the second shaping deflecting section 20 receive the deflection control signals from the shaping and deflecting control section, and the blanking electrode array 26 receives the deflection control signal from the blanking electrode array control section.

Figure 3:
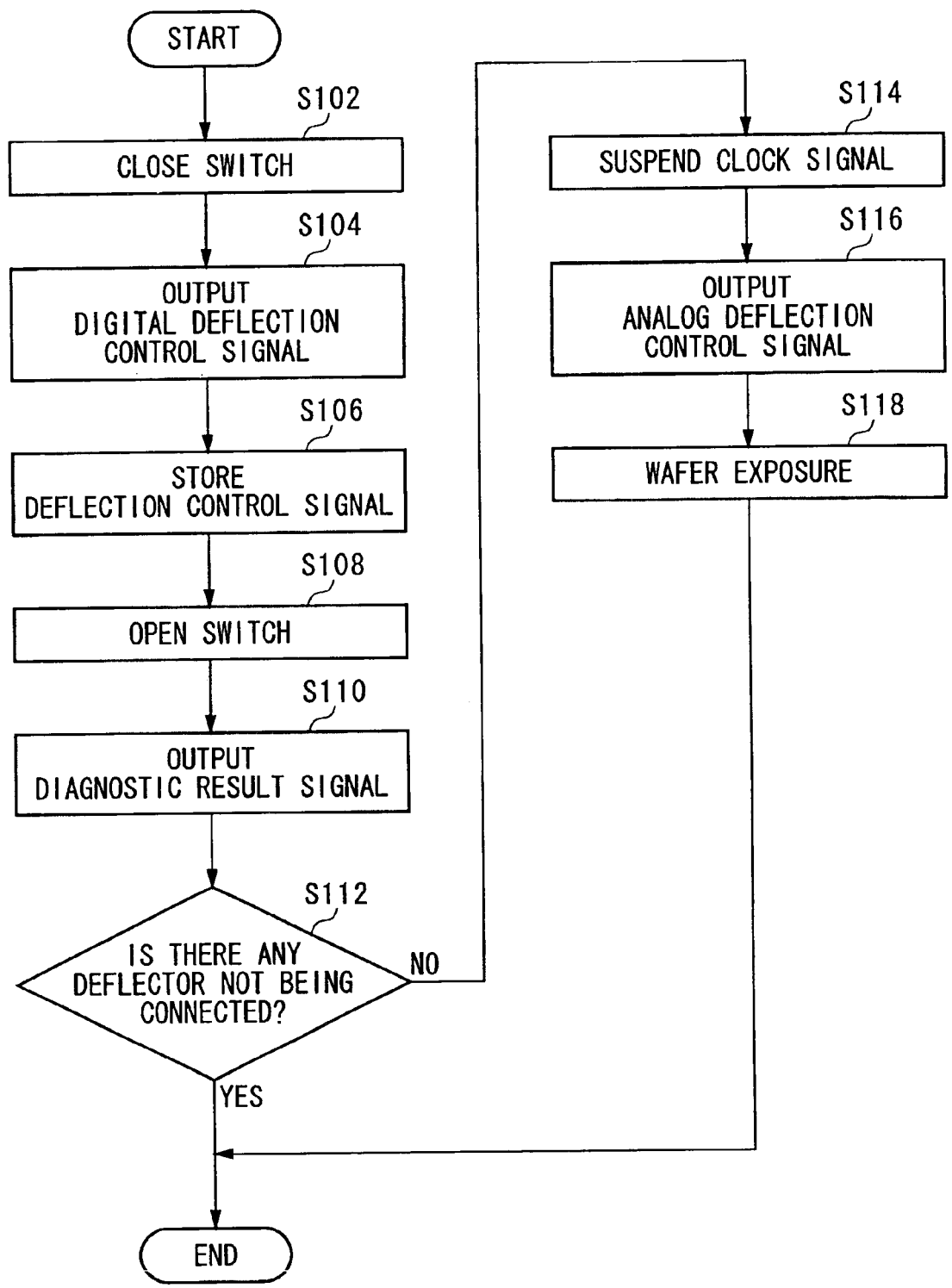
FIG. 3 is a flow chart exemplary showing an operation of the electron beam exposure apparatus.

FIG. 3 is a flow chart exemplary showing an operation of the electron beam exposure apparatus 100. First, the deflection control section 92 outputs the diagnostic control signal of the first value, and closes the switch 206 (S102). Then, the deflection control section 92 outputs the binary (0 or 1) deflection control signal (digital deflection control signal) which is to be stored in the shift register 200 (S104), and the flip-flop 204 stores the deflection control signal received by the input terminal d1 according to the clock signal (S106).

Next, the deflection control section 92 outputs the diagnostic control signal of the second value, and opens the switch 206 (S108). Then, the shift register 200 outputs the diagnostic result signal according to the clock signal (5110). Then, the deflection control section 92 diagnoses the connection between the deflection control section 92 and the deflector 202 (S112) by performing the scan test for the connection. If there is a deflector 202 which is not connected correctly, the electron beam exposure apparatus 100 terminates the operation. In this case, the electron beam exposure apparatus 100 may identify and display the deflection control signal input terminal 212 corresponding to the deflector 202 which is not connected. Thereby, the fault is easily detectable.

On the other hand, if all the deflectors 202 are connected correctly in S112, the deflection control section 92 suspends the output of the clock signal (S114), and outputs the analog deflection control signal (S116).

Next, the electron beam generating section 10 generates the electron beam 402, and the deflector 202 deflects the electron beam 402 and exposes the wafer 44 (S18). According to the present embodiment, the electrical connection between the deflection control section 92 and the deflector 202 can be diagnosed before the generation of the electron beam 402.

Here, in the present embodiment, the switch 206 is opened during the period when the deflector 202 is deflecting the electron beam. When the switch 206 is closed, the deflection control section 92 outputs the digital deflection control signal. On the other hand, when the switch 206 is opened, the deflection control section 92 outputs the analog deflection control signal. Thereby, the switch 206 interrupts the analog deflection control signal going to the shift register 200. Therefore, the deflection control section 92 outputs higher voltage than the digital deflection control signal as the analog deflection control signal. For example, the deflection control section 92 outputs the analog deflection control signal of which the voltage is higher than the gate breakdown voltage of the MOS transistor integrated on the semiconductor substrate 300. Also in this case in the present embodiment, the damage of the flip-flop 204 due to the high voltage analog deflection control signal is preventable.

Moreover, in the period when the deflector 202 deflects the electron beam 402, the deflection control section 92 suspends the output of the clock signal. Thereby, the influence of the noise accompanying the clock signal on the deflector 202 is preventable.

As described above, according to the present invention, the contact between the deflection control section and the deflector can be checked.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

What is claimed is:

1. An electron beam exposure apparatus for exposing a wafer by electron beams, comprising:
    an electron beam generating section for generating a plurality of electron beams;
    a plurality of deflectors for deflecting the corresponding electron beams;
    a deflection control section for outputting a deflection control signal for causing said deflectors to deflect the electron beams; and
    a control signal storage section for storing a value of the deflection control signal output from said deflection control section;
    wherein said control signal storage section connects the plurality of deflectors in series when self-diagnosing electrical connections in the electron beam exposure apparatus by scanning the deflection control signal through the plurality of deflectors; and
    wherein said control signal storage section and said deflectors are monolithically integrated on a semiconductor substrate.

2. The electron beam exposure apparatus as claimed in claim 1, wherein said deflection control section outputs a plurality of deflection control signals, and said deflector comprises: an aperture penetrating through the semiconductor substrate through which the electron beam passes; and a plurality of deflecting electrodes provided in edges of said aperture for receiving the plurality of deflection control signals, respectively, said plurality of deflecting electrodes being electrically isolated from one another, and said control signal storage section stores the values of the plurality of deflection control signals.

3. The electron beam exposure apparatus as claimed in claim 1, further comprising a switch for switching whether the deflection control signal is to be supplied to said control signal storage section, wherein said deflection control section outputs the deflection control signal, which is a binary signal, which is to be stored in said control signal storage section when said switch supplies the deflection control signal to said control signal storage section, and said deflection control section outputs the deflection control signal, which is an analog signal, when said switch does not supply the deflection control signal to said control signal storage section.

4. The electron beam exposure apparatus as claimed in claim 1, wherein said deflection control section supplies a plurality of deflection control signals to said plurality of deflectors, and said control signal storage section stores values of the plurality of deflection control signals in parallel, and outputs them to said deflection control section in series.

5. The electron beam exposure apparatus as claimed in claim 4, wherein said deflection control section further outputs a clock signal, said control signal storage section outputs a value of the deflection control signal according to the clock signal, and said deflection control section suspends the output of the clock signal when said deflector is deflecting the electron beam.

6. The electron beam exposure apparatus as claimed in claim 1, further comprising a signal line for connecting said deflection control section and said deflector, said signal line including a deflection control signal input terminal on a semiconductor substrate on which said control signal storage section being formed.

7. An electron beam exposure apparatus for exposing a wafer by electron beams, comprising:
    an electron beam generating section for generating a plurality of electron beams;
    a plurality of deflectors for deflecting the corresponding electron beams;
    a deflection control section for outputting a deflection control signal for causing said deflectors to deflect the electron beams; and
    a control signal storage section for storing a value of the deflection control signal output from said deflection control section;
    wherein said control signal storage section and said deflectors are monolithically integrated on a semiconductor substrate;
    wherein said control signal storage section stores values of the plurality of deflection control signals in parallel, connects the plurality of deflectors in series for scanning the deflection control signals through the plurality of deflectors, and outputs the deflection control signals to said deflection control section in series; and
    wherein said control signal storage section comprises a shift register including a plurality of flip-flops provided corresponding to said plurality of deflectors, the flip-flops storing thereon values of the corresponding deflection control signals.

8. An electron beam exposure apparatus for exposing a wafer by electron beams, comprising:
    an electron beam generating section for generating a plurality of electron beams;
    a plurality of deflectors for deflecting the corresponding electron beams;

a deflection control section for outputting a deflection control signal for causing said deflector to deflect the electron beam; and a control signal storage section for storing a value of the deflection control signal output from said deflection control section;

wherein said control signal storage section and said deflectors are monolithically integrated on a semiconductor substrate;

wherein said control signal storage section stores values of the plurality of deflection control signals in parallel, connects the plurality of deflectors in series for scanning the deflection control signals through the plurality of deflectors, and outputs deflection control signals to said deflection control section in series; and wherein said deflection control section diagnoses electrical connections between each of said plurality of deflectors and said deflection control section based on the deflection control signals output from said control signal storage section.

9. The electron beam exposure apparatus as claimed in claim 8, wherein said deflection control section identifies one of said deflectors which is not connected to said deflection control section.

10. A deflection apparatus for deflecting a plurality of electron beams based on a deflection control signal, comprising:

a control signal storage section storing thereon a value of the deflection control signal; and a plurality of deflectors for deflecting the corresponding electron beams based on the deflection control signal; and a signal line for connecting a deflection control section for generating said deflection control signal and said plurality of deflectors, said signal line including a deflection control signal input terminal on a semiconductor substrate on which said control signal storage section being formed;

wherein said control signal storage section connects the plurality of deflectors in series when self-diagnosing electrical connections in the electron beam exposure apparatus by scanning the deflection control signals through the series connected plurality of deflectors.

* * * * *